United States Patent
Ho

(10) Patent No.: US 6,586,846 B2
(45) Date of Patent: Jul. 1, 2003

(54) LOW COST DECAL MATERIAL USED FOR PACKAGING

(75) Inventor: Chung Wen Ho, Monte Sereno, CA (US)

(73) Assignee: Thin Film Module, Inc., Hsin-Chu (TW)

( * ) Notice: Subject to any disclaimer, the term of this patent is extended or adjusted under 35 U.S.C. 154(b) by 0 days.

(21) Appl. No.: 09/846,539

(22) Filed: May 2, 2001

(65) Prior Publication Data

US 2001/0016370 A1 Aug. 23, 2001

Related U.S. Application Data

(62) Division of application No. 09/419,512, filed on Oct. 18, 1999, now Pat. No. 6,287,890.

(51) Int. Cl.⁷ .............................................. H01L 29/40
(52) U.S. Cl. ...................... 257/784; 257/659; 257/712; 257/718
(58) Field of Search .................................. 257/659, 712, 257/778, 784; 438/106, 112, 124

(56) References Cited

U.S. PATENT DOCUMENTS

| | | | |
|---|---|---|---|
| 5,055,907 A | 10/1991 | Jacobs | 357/71 |
| 5,151,388 A | 9/1992 | Bakhit et al. | 437/209 |
| 5,192,716 A | 3/1993 | Jacobs | 437/209 |
| 5,285,352 A * | 2/1994 | Pastore et al. | 361/707 |
| 5,485,038 A | 1/1996 | Licari et al. | 257/758 |
| 5,509,553 A | 4/1996 | Hunter, Jr. et al. | 216/13 |
| 5,525,834 A | 6/1996 | Fischer et al. | 257/691 |
| 5,633,047 A | 5/1997 | Brady et al. | 427/437 |
| 5,724,232 A | 3/1998 | Bhatt et al. | 361/762 |
| 5,796,164 A | 8/1998 | McGraw et al. | 257/723 |
| 5,804,467 A * | 9/1998 | Kawahara et al. | 438/112 |
| 5,830,563 A | 11/1998 | Shimoto et al. | 428/209 |
| 5,837,427 A | 11/1998 | Hwang et al. | 430/312 |
| 5,866,943 A * | 2/1999 | Mertol | 257/712 |
| 5,877,551 A | 3/1999 | Tostado et al. | 257/701 |
| 5,891,795 A | 4/1999 | Arledge et al. | 438/613 |
| 5,925,930 A | 7/1999 | Farnworth et al. | 257/737 |
| 6,110,650 A * | 8/2000 | Bhatt et al. | 430/313 |
| 6,423,570 B1 * | 7/2002 | Ma et al. | 438/106 |

* cited by examiner

*Primary Examiner*—David Nelms
*Assistant Examiner*—Dao H. Nguyen
(74) *Attorney, Agent, or Firm*—George O. Saile; Stephen B. Ackerman

(57) ABSTRACT

A new method is provided for mounting high-density IC semiconductor devices. A layer of epoxy is deposited over the first surface of a metal panel. One or more thin film interconnect layers are then created on top of the epoxy layer. The BUM technology allows for the creation of a succession of layers over the thin film layers. The combined layers of thin film and BUM form the interconnect substrate. One or more cavities are created in the second surface of the metal panel; openings through the layer of epoxy are created where the layer of epoxy is exposed. One or more IC semiconductor die are inserted into the cavities, are electrically connected to the openings that have been created in the layer of epoxy. Openings are created in the bottom BUM layer; solder balls are inserted and attached to this BUM layer for the completion of the Ball Grid Array (BGA) package.

7 Claims, 4 Drawing Sheets

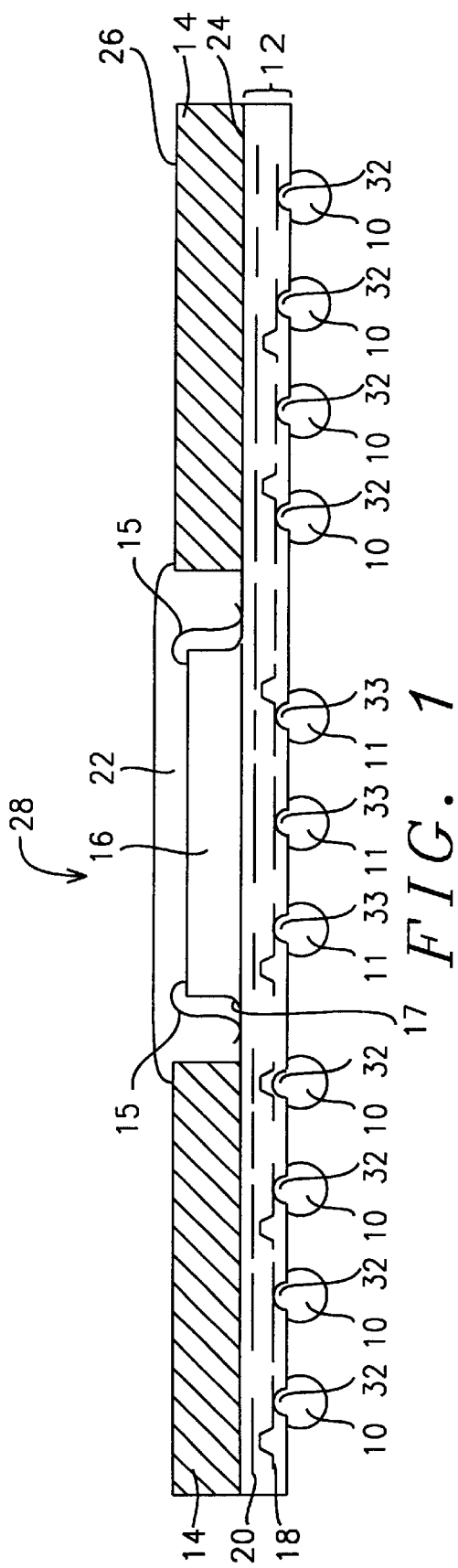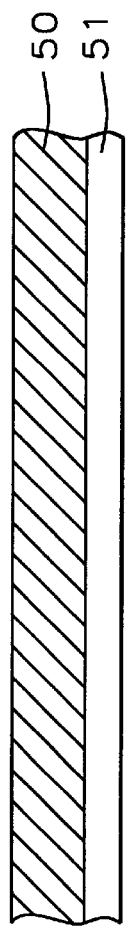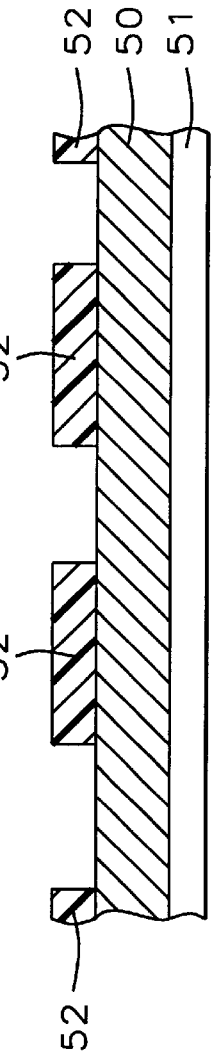
FIG. 1
FIG. 2a
FIG. 2b

LOW COST DECAL MATERIAL USED FOR PACKAGING

This is a division of patent application Ser. No. 09/419,512, filing date Oct. 18, 1999, now U.S. Pat. No. 6,287,890 Low Cost Decal Material Used For Packaging, assigned to the same assignee as the present invention.

BACKGROUND OF THE INVENTION (1) Field of the Invention

The invention relates to the fabrication of Printed Circuit Boards (PCB's) that are used with integrated circuit devices, and more particularly, to a method of creating a structure for the mounting of semiconductor die.

(2) Description of the Prior Art

Printed Circuit Boards (PCB's) are being used extensively in the creation of large semiconductor functional units. The PCB serves a number of different functions when used to mount semiconductor devices such as providing mechanical or structural support for the semiconductor devices, the ability to significantly increase the number of Input/Output (I/O) terminals, the ability to reduce thermal constraints that otherwise would be imposed on the semiconductor device. To enable the mounting of semiconductor devices on the surface of a PCB, different device packages have been developed. Among these different packages, the Quad Flat Package (QFP) and the Ball Grid Array (BGA) package are frequently used.

Quad Flat Packages (QFP) have in the past been used to create surface mounted high pin count integrated packages with various pin configurations. The electrical connections with these packages are typically established by closely spaced leads that are distributed along the four edges of the flat package. This limits the usefulness of the QFP since a high Input/Output (I/O) count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Increased I/O count combined with increased requirements for high performance IC's has led to the development of Flip Chip packages. A flip chip is a semiconductor chip that has a pattern or arrays of terminals spaced around an active surface of the flip chip for face down mounting of the flip chip to a substrate. Flip chip technology fabricates bumps (typically Pb/Sn solder) on Al pads on the chip and interconnects the bumps directly to the package media, which are usually ceramic or plastic based. The flip-chip is bonded face down to the package through the shortest paths. These technologies can be applied not only to single-chip packaging, but also to higher or integrated levels of packaging in which the packages are larger, and to more sophisticated package media that accommodate several chips to form larger functional units. Flip chip attachment consists of attaching a flip chip to a printed circuit board or other substrate. The flip chip is bonded to the printed circuit board by refluxing the solder balls. The solder balls may also be replaced with a conductive polymer.

The flip-chip technique, using an area array, has the advantage of achieving the highest density of interconnection to the device and a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder lead joints that can lead to joint breakage caused by solder fatigue from temperature cycling operations.

In packaging ball grid array and flip-chip semiconductor devices, these devices are mounted on the surface of a package substrate; the plastic package substrate typically is an extension of a Printed Circuit Board made using the more advanced PWB technology. The contact points of the BGA/flip-chip make contact with contact points in the top surface of the substrate, the substrate re-distributes (fan-out) the BGA/flip-chip contact points. The lower surface of the substrate has the contact points (balls) that are connected to the surrounding circuitry and that form the interface between the BGA/flip-chip contact balls and this surrounding circuitry. The original contact balls of the BGA/flip chip packages are encased in a molding material (for instance epoxy) for protection of these balls. The molding is encased between the lower surface of the BGA/flip-chip device and the upper surface of the substrate. This molding is referred to as underfill since it is filled in under the original BGA/flip-chip device.

In PCB manufacturing, multiple layers of printed circuits are created inside the printed circuit board. These layers are superimposed and are electrically isolated from each other. The printed circuits that make up the various layers of the PCB establish the electrical interconnections between the semiconductor devices and the surrounding circuitry.

Prior Art substrate packaging uses ceramic and plastic Ball Grid Array (BGA) packaging. Ceramic substrate packaging is expensive and has proven to limit the performance of the overall package. Recent years have seen the emergence of plastic substrate BGA packaging; this type of packaging has become the mainstream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 mm.), the plastic BGA structure becomes complicated and expensive. This can be improved by using the multi-layer structure used to create the plastic BGA package. This multilayer structure deposited on both sides of a core board, one layer at a time for the plastic BGA interconnect package, is referred to as the Build Up Multilayer or BUM approach and results in a line density within the package of typically 2–3 mil or 50 u–75 u range. This line density is not sufficiently high for realizing the fan out from the chip I/O to the solder balls on the package within a single layer. This leads to the multi-layer approach. The multi-layer approach brings with it the use of relatively thick (50 u–75 u) dielectric layers, these layers have a TCE (Thermal Coefficient of Expansion) that is considerably higher than the TCE of the laminate board on which the plastic BGA package is mounted. To counteract this difference in TCE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Another approach is the use of a flexible film as the starting material. A polymer film, such as the polyimide film or an epoxy based film of 2 to 3 mil thick with or without a copper layer attached to it, is processed by metalization and patterning on one or both sides. A completed two metal layer film, described as a layer pair, can be used as a packaging substrate material. Subsequent dielectric and copper layers can be build up on the processed first metal layer, such as the RCC (Resin Coated Copper) approach. Alternatively, two or more layer pairs can be bonded together to make a multilayer structure. The advantage of this approach is that it uses a minimum amount of material. However, because of the lack of stability of the film, the line and space density is limited to that of the BUM structure described herein, which is not sufficiently high for the high density packaging that is used to achieve a low cost substrate, having only a few interconnect layers.

Other Prior Art applications use thin film interconnect layers for flip chip or wire bond packaging substrates. These applications start with a laminate substrate onto which the thin film layers are deposited. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming thereby adding cost to the process. Further, the planarity of the laminate substrate does not meet planarity requirements for the deposition of thin films. Improved planarity for the surface of the laminate substrate is established by depositing dielectrics and metal layers on the initial surface of the laminate structure, steps that again add to the processing cost of the BGA structure. Since the laminate substrate-is composed using organic materials, the substrate is not dimensionally stable resulting in warpage and dimensional variations during high temperature processing and wet chemical interactions. This results in additional processing complications and costs.

This invention teaches a novel process and structure for creating packaging substrates that are used for wire bonded and flip chip semiconductor devices. As such, the process and package of the invention are similar to previous high-density flip chip BGA packages. The term BGA of the invention refers to the ball grid array that is connected to for instance a Printed Circuit Board but where the contact balls of this array are connected to a (wire bonded or flip chip) IC device via a substrate that is created by the process of the invention.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 um thick) and thin dielectric layers (12 to 75 um), see col. 7 and 8.

U.S. Pat. No. 5,877,551 (Tostado et al.) discloses a package having a metal substrate with (2) dielectric layers formed of polymers, epoxy (3 to 100 um), see col. 4.

U.S. Pat. No. 5,485,038 (Licari et al.) teaches a package using a photo-imagable epoxy dielectric layer.

SUMMARY OF THE INVENTION

A principle objective of the invention is to provide an inexpensive and reliable method for high-density wire bond and flip chip semiconductor device manufacturing.

Another objective of the invention is to provide a wire bond and flip chip device package that significantly improves the cooling of the Integrated Circuit device that is mounted therein.

Another objective of the invention is to reduce performance limitations imposed by Prior Art high-density wire bond and flip chip semiconductor manufacturing techniques.

Yet another objective of the invention is to provide for high pin fan-out for wire bond and flip chip semiconductor devices.

Yet another objective of the invention is to eliminate the need for counter-balancing the effects of thick layers of dielectric used in conventional high-density wire bond and flip chip semiconductor device manufacturing.

Yet another objective of the invention is to provide a method of packaging high density wire bond and flip chip semiconductor devices by using Build Up Multilayer (BUM) technology in combination with thin film deposition techniques.

Yet another objective of the invention is to provide an initial surface with good planarity for the creation of high-density wire bond and flip chip semiconductor structures.

A still further objective of the invention is to provide a structure devoid of warpage and dimensional variations during high temperature or wet chemical processing for the creation of high-density wire bond and flip chip semiconductor structures.

A still further objective of the invention is to provide a high density interconnection structure in which epoxy is used in a decal form and is under tension and is suspended across an opening to allow for chip placement on one side of the interconnect structure while the placement of BGA spheres is on the other side of the interconnect structure.

In accordance with the objectives of the invention a new method is provided for mounting high-density wire bond semiconductor devices. The invention starts with a metal panel (also referred to as the metal substrate); a liquid thin film of epoxy or a laminated layer of dry epoxy is deposited over the first surface of the metal panel. One or more metal interconnect layers are then created on top of the epoxy layer. The metal interconnect layers are patterned in succession to create metal interconnect patterns. The BUM technology allows for the creation of a succession of layers (of metal interconnects) over the thin film layers. Each of the BUM layers created in this manner can be created for a specific function such as power or ground distribution and signal or fan-out interconnect. The combined layers of (epoxy) thin film and BUM form the interconnect substrate.

One or more cavities are created in the second surface of the metal panel; openings are created through the layer of epoxy where wire bond or flip chip contact metal pads underneath the epoxy are exposed within the perimeter of the cavities. In addition, a metal die pad underneath the epoxy is partially or completely exposed to facilitate die attach and heat removal in the case of a wire bond chip (no die pad is required for a flip chip). One or more semiconductor die are inserted into the substrate cavity and are wire bonded or flip chip connected to the openings that have been created in the layer of dielectric.

After the fabrication of the metal panel is complete, each substrate on the panel is tested. The substrates are singulated from the panel by cutting. Openings are created in the bottom BUM layer; solder balls are inserted and attached to this BUM layer for the completion of the Ball Grid Array (BGA) package.

An added advantage of the process of the invention is that the Thermal Coefficient of Expansion (TCE) of the epoxy is higher than the TCE of the metal substrate. The film that is present in the bottom of the cavity is therefore under tension and is stretched taut. This film also absorbs little water (<1%) and is therefore a stable surface that does not sag or otherwise deform.

BRIEF DESCRIPTION OF THE DRAWINGS

FIG. 1 shows a single chip wire bond chip package with two interconnect layers.

FIGS. 2a through 2f show the processing steps used during the thin film deposition process.

DESCRIPTION OF THE PREFERRED EMBODIMENTS

Figure 2C:
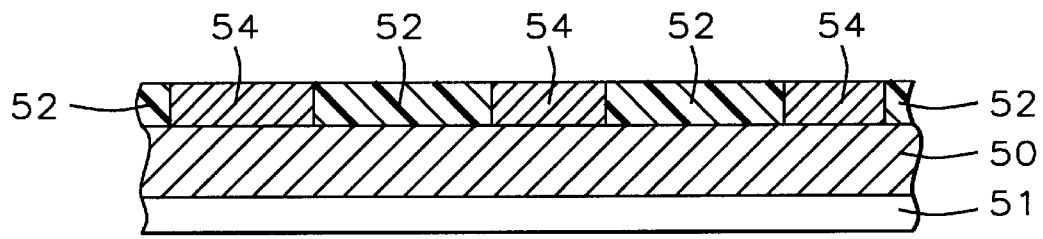

In building the various layers of a PCB, epoxy has been widely used as the base material for the layers of the PCB. This because of the low cost, wide availability and versatility of epoxy. Epoxy is however limited to the creation of multilayer laminated PCB's, this type of-PCB is the most widely used type of PCB. Another approach in creating PCB's is to use a free standing film of about 2 mil thick. Electrical design requirements and the restraints that are imposed by these requirement frequently call for a layer of dielectric that has a thickness of no more than 0.5 mil (12 u). For these applications, the free standing film is not an option since free standing films that are less than 1 mil thick cannot be handled in a semiconductor manufacturing environment.

In conventional fabrication methods that are used to create packaging substrates, polyimide films are frequently used. However, polyimide is a very expensive material, typically costing $400/kg whereas the equivalent liquid epoxy costs about $60/kg. Polyimide further has the disadvantage that it needs to be cured at a temperature of close to 400 degrees C. while epoxy curing requires a temperature of less than 200 degrees C. The higher temperature curing of the polyimide is not only expensive as far as the thermal budget is concerned but a temperature of that magnitude also causes the substrate to be deformed (bow, warp) due to the difference in CTE between the cured film of polyimide and the substrate.

Epoxy is a general term that covers a broad family of materials that are used in the PCB industry. The basis epoxy compound is created by the reaction of two components, that is epichlohydrine and bisphenol-A, the epoxy that is formed in this manner is referred to as ER4. Another material that has a higher glass transition temperature than FR4, known as BT, uses the material bismaleimide as a substitute for bisphenol-A for the reaction. Other materials, such as multifunctional and cynaester, are all part of the family of compounds that belong to the epoxy family.

The use of epoxy as a base material for the fabrication of PCB's is well known. However, the use of epoxy for this purpose is always applied in one of two different methods, that is:

1) deposit a liquid film (or build a layer by lamination of a dry film of epoxy) on a rigid substrate and use the completed rigid substrate as the packaging substrate, or 2) use a glass reinforced epoxy film or a copper backer epoxy film as the starting material for creating the packaging substrate.

The epoxy of the invention can be either particle filled or glass filled. Particle filled epoxy is commercially available as Ciba Probelec 81 or Du Pont Via Lux 81, glass filled epoxy is commercially available as Allied Signal Ultra Stable 1, 2 and 3 or as Hitachi 679P. The thickness of the epoxy layer can vary between about 12 u to in excess of 2 mils. Probelec 81 is a photopolymer resin of photo-imageable material that allows the mass formation of ultra small vias for the creation of high density interconnects. Probelec 81 is composed of epoxy and a photosensitive component to which is added proprietary particle material, this combination provides a material that gives excellent results when applied in creating a thin film on the surface of a metal substrate using the process of the invention.

The epoxy film is deposited on the first surface of a metal panel using either a wet or a dry process. One or more layers of metal interconnects are created over the thin film of epoxy thereby creating a multi layer structure. A cavity is next created in the second surface of the metal substrate, this cavity is used to insert a semiconductor die and either wire bond or flip chip connect the semiconductor die to the multi layer structure.

Referring now specifically to FIG. 1, there is shown a cross section of a single wire bond chip with two interconnect layers.

The interconnect substrate 12 contains the totality of the sequence of layers that are created within the scope of the invention for making a high density packaging substrate.

The interconnect substrate 12 that has two surfaces. The surface of the interconnect substrate into which the contact balls 10 are mounted is the first surface of the interconnect substrate. The surface of the interconnect that is in contact with the metal substrate 14 is the second surface of the interconnect substrate.

The metal substrate 14 has two surfaces, the first surface 24 of the metal substrate 14 is the surface on which the interconnect substrate 12 is created. The second surface 26 of the metal substrate is the surface into which openings are etched for the insertion of wire bond chips.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The two interconnect layers within the interconnect substrate 12 are highlighted as 18 (which can be a ground or power layer) and 20 (which can be a signal layer). Metal substrate 14, typically copper, is between about 30 to 40 mils thick. The metal used for substrate 14 is not limited to copper but can be other metals such as aluminum or stainless steel.

The size of the metal substrate 14 is typically 18×24 inches but the size of the metal substrate 14 is not limited to these dimensions. The process of creating the package of the invention starts with a large metal panel that contains adequate surface area for the creation of a multiplicity of wire bond packages. This large metal substrate is at a given point in the process divided into a number of smaller metal substrates whereby each of these smaller metal substrates is used to further create one package of the invention.

The invention uses the Build Up Multilayer (BUM) technology (a printed circuit board technology) in combination with thin film deposition technology (a semiconductor like technology used for the creation of multi chip modules or flat panels).

It must be noted from FIG. 1 that the metal substrate 14 and the contact balls 10 are-mounted on opposite sites of the interconnect substrate 12 while the metal substrate 14 and the contact balls 10 are also aligned with each other (the metal substrate 14 is located above the contact balls 10). It must further be noted from FIG. 1 that additional contact balls 11 are provided for connections to the interconnect substrate 12, these contact balls 11 are located directly underneath the wire bond chip 16. The wire bond chip or flip chip 16 is mounted in an opening 28 that has been created in the metal substrate 14. The opening 28 into which the wire bond chip or flip chip 16 is mounted is a cavity that is created by masking and etching of the second side 26 of the metal substrate 14.

An epoxy thin film (not shown) is first deposited over the metal substrate 14 on the first side 24 of the metal substrate 14. This deposition of the epoxy can be done by either lamination of a dry film or by depositing a liquid film of epoxy (a coating and curing process). The layer of epoxy typically has a thickness of between about 10 and 50 um. It so happens that the epoxy has a TCE (Thermal Coefficient of Expansion) that is higher than the TCE of the metal substrate. This to assure that, after the metal substrate with the deposited layer of epoxy are cooled down to room temperature, the epoxy film is under tension. The thin film layer of epoxy can be with or without a thin glass fiber reinforcement or a particle filled epoxy.

The first step in the creation of the interconnect substrate 12 is the creation of a thin film interconnect metal layer 20 on top of the layer of the layer of epoxy.

Figure 2D:
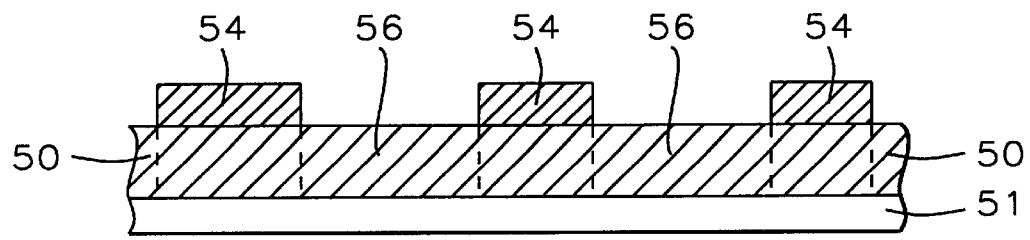
Figure 2E:
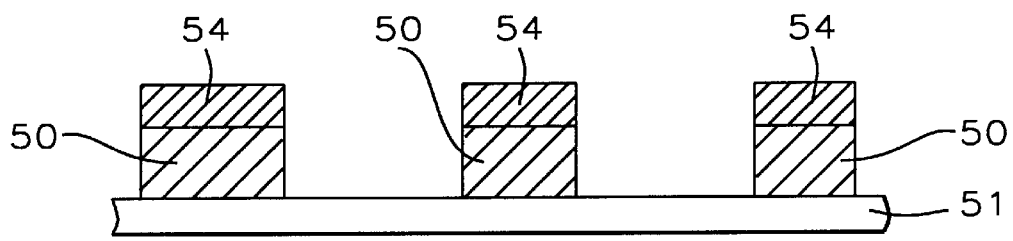
Figure 2F:
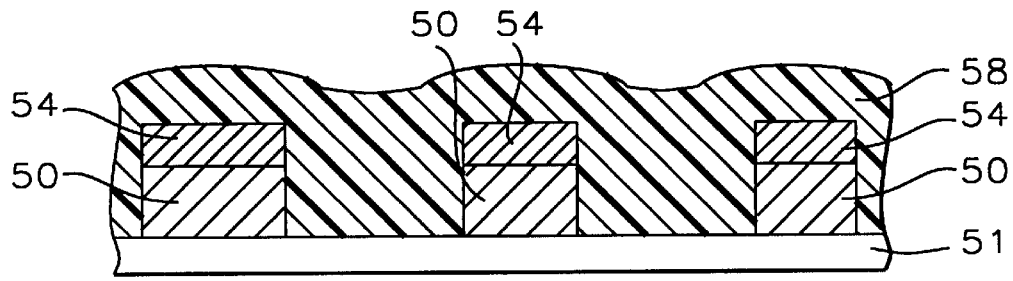

The thin film deposition technique contains the following steps, see FIGS. 2a through 2f:

FIG. 2a, depositing an interconnect plating base 50 over a surface 51 such as the surface of metal panel 14 of FIG. 4 by consecutive sputtering of Cr, Au and Cr FIG. 2b, masking and patterning 52 for semi-additive plating of the interconnect pattern;

FIG. 2c, wet etching the thin Cr layer to expose the Au, depositing semi-additive plating 54 of the interconnect pattern by depositing Au, Ni and Cu;

FIG. 2d, removing of the mask 52 (FIG. 2b) for the semi-additive plating of the interconnect pattern;

FIG. 2e, wet etching to remove the sputtered plating base 56, FIG. 2d, from between the interconnect pattern 54;

FIG. 2f, coating the created interconnect pattern with a layer 58 of dielectric;

for applications where wire bond connections need to be made to the interconnect pattern the above dielectric forms a solder mask and vias are created in the dielectric for the solder connections.

It must be pointed out that, where the example of FIGS. 2a through 2f shows the creation of only one layer of thin film, the invention is not limited to one layer of thin film. A number of thin film layers can be superimposed, dependent on and determined by design packaging requirements. Where limitations arise in the number of overlying layers of thin film that can be applied, these limitations are not limitations that are imposed by the invention but are rather conventional limitations of thin film deposition technology or electrical performance characteristics.

The state of the art BUM technology provides the technology to add layer 18 on top of the created thin film interconnect layer 20, this added layer 18 typically can be for power and ground interconnects but can also be used for fan-out interconnections. Patterns are created in the additional layer 18, typically for ground and power distribution but not limited to this.

It must further be pointed out that, although the example shown in FIG. 1 shows only one BUM layer, the invention is not limited to only one such layer. The invention allows for a multiplicity of BUM layers that can be superimposed over one or more thin film layers.

It must also be pointed out that the invention does not require that a BUM layer is deposited over the thin film layer. It is entirely conceivable that the package of the invention is created using no BUM layers and that the interface substrate contains two or more layers of thin film. Furthermore, the package of the invention is created using no thin film layers while the interface substrate contains two or more BUM layers.

The last layer created in this manner, that is the layer 18 in FIG. 1 or the layer furthest removed from the first side 24 of the metal substrate 14, must provide the interconnects with the contact balls of the BGA structure and must therefore be coated as a solder mask.

Figure 3A:
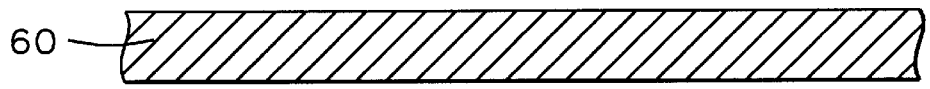
FIGS. 3a through 3f show the processing steps used during the BUM process.
Figure 3B:
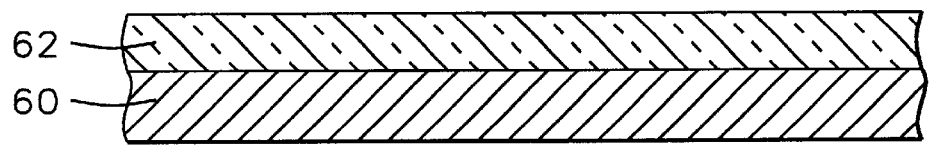
Figure 3C:
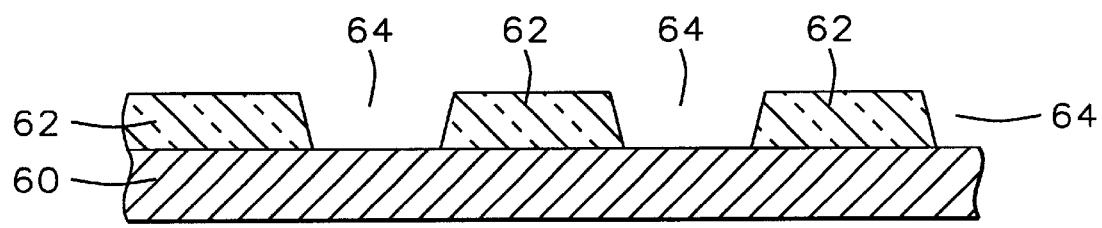
Figure 3D:
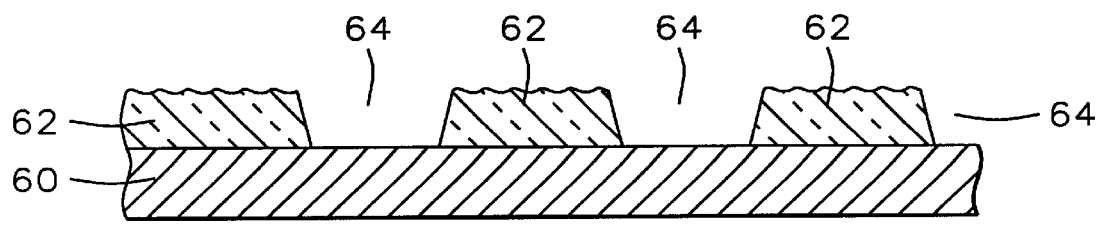
Figure 3E:
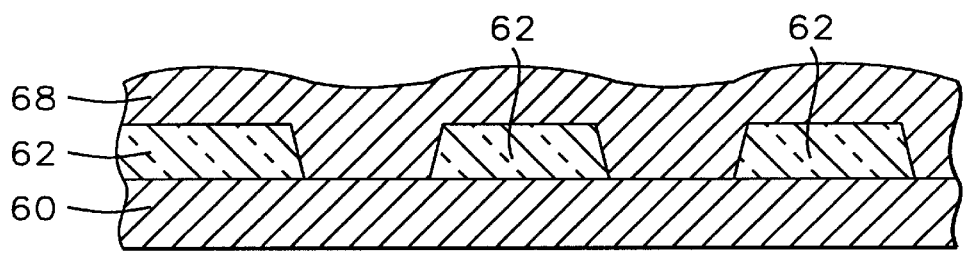
Figure 3F:
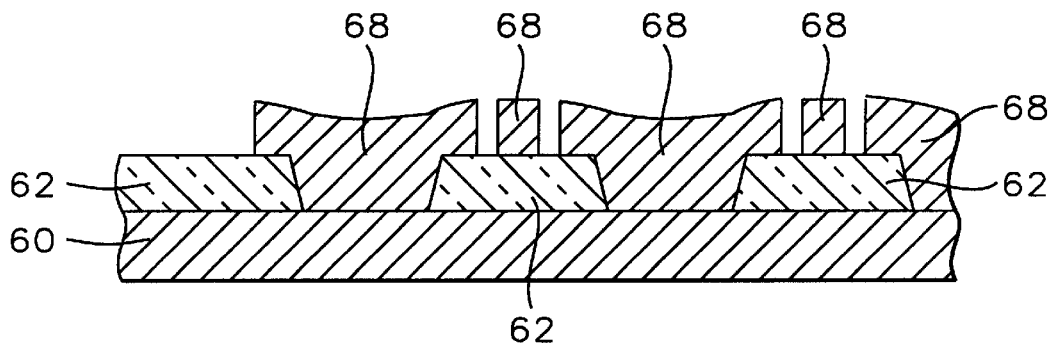

The BUM state of the art technology contains the following processing steps, see FIGS. 3a through 3f:

FIG. 3a, cleaning of the surface of the metal substrate 60;

FIG. 3b, coating of the metal substrate with a layer 62 of dielectric;

FIG. 3c, creating of vias 64 in the dielectric 62 for electrical connections to the metal substrate 60;

FIG. 3d, etching and swelling of the dielectric 62 to roughen the surface and thereby promote adhesion for the subsequent electroless copper deposition;

FIG. 3d, electroless seeding of the dielectric 62;

FIG. 3e, plating of the panel with a layer 68 of copper;

FIG. 3f, masking and etching the deposited layer 68 of copper to create the metal pattern 68 of the BUM layer.

The second side 26 of the metal substrate must next be prepared for the mounting of the wire bond chip or the flip chip; an opening or cavity 28 must therefore be created in the metal substrate 14 that can accommodate the chip. The second side 26 of the metal substrate 14 is therefore masked and wet etched to create the opening 28 in the metal substrate 14. The size of this opening can vary and depends on the number of chips that are to be mounted on the interconnect substrate 12. The wet etch of the second side 26 of the metal substrate exposes the epoxy layer that has previously been deposited (on the first side 24 of the metal substrate 14, see above).

It is clear that, although FIG. 1 indicates the mounting of only one IC die 16 inside opening 28, the invention is not limited to one die. By creating a larger opening 28 (or a multiplicity of openings) a multiplicity of IC dies can be inserted into the metal substrate and can, again using wire bond or flip chip connection techniques, be interconnected to the interface substrate.

After the cavity 28 has been created in the second surface 26 of the metal substrate 14 (thereby exposing the layer of epoxy that has been deposited over the first surface 24 of the metal substrate), openings are created in the exposed layer of epoxy through which electrical contact is established with points of contact in the bottom layer 20 of the interface substrate 12. One large opening or a matrix of small openings are created in the exposed layer of epoxy on top of a metal die pad onto which the die is to be placed for the die bonding and for heat removal purposes. These openings are created using laser technology. For flip chip connection, a matrix of small openings is created in the epoxy layer to expose the flip chip bond pads underneath the epoxy layer.

At this point in the process, the metal panel is subdivided or singulated into individual metal panels for individual wire bond packages. Each substrate is electrically tested either before or after the metal panel is subdivided into individual substrates.

Before the wire bond chip is inserted into cavity 28, an adhesive layer 17 is provided over the surface of the exposed die pad inside opening 28 for die bond. The wire bond chip or flip chip 16 is inserted into the cavity 28, the wire bond chip or flip chip 16 is die bond or reflow bonded (for the flip chip) to the bottom layer 20 of the interconnect substrate 12. For the wire bond chip, each chip pad is wire bonded to the corresponding substrate pad. A glob top or over molding (typically using epoxy) 22 is applied over the wire bond chip 16 thereby providing further protection for the die 16. For the flip chip case, an underfill epoxy material is used to flow under the die and to seal the flip chip solder balls to enhance the reliability of the solder ball connection.

The openings 32 and 33 for the BGA solder ball connections are created to expose the top metal pads (the pads in the interconnect layer 18 that are furthest away from the metal substrate 14). Interconnect layer 18 is brought into contact with the contact balls 10 and 11, the contact balls are attached to layer 18 by reflow of the contact balls.

It is clear that the packaging of the IC die is at this time completed. Electrical contacts have been established by connecting the Ball Grid Array solder balls 10/11 either through the interface substrate 12 and the wire bond connections 15 to the wire bond pads on the IC die 16 or through the interface substrate 12, the solder balls to the flip chip bond pads on the IC die.

The invention provides a method for mounting a wire bond or flip chip IC chip within a metal substrate whereby the IC chip is mounted with its active surface (the surface that contains the points of electrical contact of the chip) facing upwards (for the wire bonded chip), that is facing away from the above defined interconnect substrate, or downwards (for the flip chip). The wire bond chip 16 is connected to the interconnect substrate 12 using wire bonding 15, as indicated. The chip is further brought into close physical contact with the underlying interconnect substrate 12 by means of the adhesive layer 17 that has been applied between the chip 16 and the interconnect substrate 12. The combination of surfaces and substances that surround the IC die 16, that is the adhesive layer 17, the (epoxy) glob top/over molding 22 and the interconnect substrate 12, provide a substantial and direct path of heat flow from the IC die 16 to the metal substrate 14 from where the heat can further be conducted away from the IC die 16 through the solder balls 10 and 11 and into the printed circuit board onto which the package is mounted. Typical thin film dielectric have a thickness between about 0.5 and 1.0 mil and are therefore not a significant inhibitor to heat transfer. Conventional plastic BGA packages use FR4/BT laminates that are several mils thick and have therefore a high resistance to heat transfer. The invention therefore provides a key advantage of significantly improving the cooling the IC devices that are mounted in the package of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for mounting one or more Integrated Circuit chips by creating an interface substrate overlying a metal substrate, said structure containing:

a metal substrate, said metal substrate having a first surface and a second surface;

a layer of epoxy with a thickness between about 0.5 mils and 3 mils deposited over said first surface;

a thin film interconnect layer deposited over of said layer of epoxy, thereby forming a first layer of an interconnect substrate;

a Build Up Multilayer (BUM) layer created over said interconnect layer, thereby forming a second layer of said interconnect substrate;

a coating over said BUM layer as a solder mask;

metal pads within said BUM layer created by etching, thereby creating openings for BGA solder connections;

one or more openings for insertion of said one or more IC chips created by masking and etching said second surface of said metal substrate, thereby furthermore creating exposed portions of said epoxy within said openings;

openings selectively created in said exposed epoxy, thereby providing electrical access and heat transfer to said interconnect substrate for said one or more IC chips;

individual IC device substrates created by subdividing said metal substrate;

a layer of adhesive containing thermally conductive epoxy, created by coating said exposed epoxy of said individual IC device substrates for the wire bond die while the adhesive is not required for the flip chip;

one or more IC chips inserted into said one or more openings for the insertion of said wire bonded IC chips in said individual IC device substrates, whereby said IC chips overlay said adhesive coating;

electrical connections for said IC device chips to said selectively created openings in said epoxy by wire bond or reflow solder for the flip chip case;

a molding compound inserted over said one or more IC chips and within said one or more openings for the insertion of said IC chips; and solder balls inserted and attached to said BGA solder connections.

2. The structure of claim 1 wherein said Integrated Circuit chips are wire bond chips or flip chips.

3. The structure of claim 1 wherein the selective openings in said exposed epoxy for electrical access and heat removal for IC chips are processed using laser technology.

4. The structure of claim 1 wherein said interface Substrate comprises when proceeding from the side of the interface substrate that is closest to said metal substrate:

one or more thin film interconnect layers deposited over said epoxy layer;

a coating of dielectric over the thin film layer that is furthest removed from said metal substrate; and a solder mask thereby creating vias in said coating of dielectric over said thin film layer for connections between said thin film layer and the BGA contact balls.

5. The structure of claim 1 wherein said interface substrate contains when proceeding from the side of the interface substrate that is closest to said metal substrate:

one or more thin film interconnect layers deposited over said epoxy layer;

one or more BUM layers deposited over said second interconnect layer;

a coating of dielectric over the BUM layer that is furthest removed from said metal substrate; and a solder mask thereby creating vias in the dielectric for connections between said BUM layer and the BGA contact balls.

6. The structure of claim 1 whereby said claim is extended to include creating a multiplicity of Build Up Multilayer structures and a multiplicity of thin film interconnect layers said BUM layers overlying said thin film interconnect layers said thin film interconnect layers to be deposited over said epoxy deposited on said first surface of said metal substrate.

7. The structure of claim 1 wherein said thermally conductive epoxy is thermoset epoxy or thermoplastic epoxy.

* * * * *